United States Patent
Ingerly et al.

(10) Patent No.: US 6,930,033 B2
(45) Date of Patent: Aug. 16, 2005

(54) TREATING SURFACE OF LOW-DIELECTRIC CONSTANT MATERIAL TO ACHIEVE GOOD MECHANICAL STRENGTH

(75) Inventors: Douglas B. Ingerly, Portland, OR (US); Brett R. Schroeder, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/740,337

(22) Filed: Dec. 17, 2003

(65) Prior Publication Data

US 2004/0132281 A1 Jul. 8, 2004

Related U.S. Application Data

(62) Division of application No. 10/291,027, filed on Nov. 8, 2002, now Pat. No. 6,717,265.

(51) Int. Cl.$^7$ .......................................... H01L 21/4763
(52) U.S. Cl. ........................................ 438/618; 438/622
(58) Field of Search ................................. 438/618, 622, 438/624–627, 637

(56) References Cited

U.S. PATENT DOCUMENTS

| 6,417,098 B1 | 7/2002 | Wong et al. |
| 6,603,204 B2 * | 8/2003 | Gates et al. ................ 257/760 |

* cited by examiner

*Primary Examiner*—Roy Potter
(74) *Attorney, Agent, or Firm*—George Chen

(57) ABSTRACT

The present invention discloses a method including providing a substrate; forming a dielectric material over the substrate; forming an opening in the dielectric material; treating a surface of the dielectric material; forming a conductor in the opening; and planarizing the conductor.

The present invention further discloses a structure including a substrate; a dielectric material located over the substrate, the dielectric material having a low dielectric constant; an opening located in the dielectric material; a treated layer located over a sidewall of the opening; and a conductor located in the opening and over the treated layer.

11 Claims, 2 Drawing Sheets

TREATING SURFACE OF LOW-DIELECTRIC CONSTANT MATERIAL TO ACHIEVE GOOD MECHANICAL STRENGTH

This is a Divisional application of Ser. No. 10/291,027, filed Nov. 8, 2002, now U.S. Pat. No. 6,717,265 therein.

BACKGROUND OF THE INVENTION

1. Field of the Invention

The present invention relates to the field of semiconductor integrated circuit (IC) manufacturing, and, more specifically, to a method of forming a low-dielectric constant material with good mechanical strength and a structure having a low-dielectric constant material with good mechanical strength.

2. Discussion of Related Art

Transistors are typically fabricated on a chip by using a substrate of semiconductor material, such as Silicon, and electrically insulating material, such as Silicon Oxide or Silicon Nitride. The transistors are subsequently wired with electrically conducting material, such as Aluminum or Copper, that are stacked in multiple layers and separated by electrically insulating material.

In 1965, Gordon Moore first suggested that the number of transistors per unit area on a chip could be doubled every 18 months. Over the ensuing decades, the semiconductor industry has adhered closely to the so-called Moore's Law. Maintaining such a schedule for each device generation, or technology node, has required continual enhancements to the processes of photolithography and etch to reduce the critical dimension (CD) that may be successfully patterned in the features across the chip. In addition, significant improvements had to be made to desired doping profiles and film thicknesses across the chip.

Photolithography was able to keep up with the reduction in CD needed for each device generation. However, improving the resolution usually required sacrificing the depth of focus (DOF). The process window would be large enough only if the smaller DOF could be countered by a reduction in topography at the surface of the substrate in which the transistors are being formed. Thus, chemical-mechanical polish (CMP) became an enabling technology for both the front-end and the back-end of semiconductor processing.

In order to improve device density, both the transistor in the front-end of semiconductor processing and the wiring in the back-end of semiconductor processing have to be scaled down. The scaling of the transistor and the wiring must be carefully balanced to prevent limitation of the switching performance. The switching performance of the transistor may be degraded by excessively large resistance-capacitance (RC) product delay in the wiring. Resistance in the wiring may be reduced by using electrically conducting material having a lower resistivity. Capacitance in the wiring may be reduced by using an electrically insulating material with a lower dielectric constant (k).

However, an electrically insulating material with a low dielectric constant may not be strong enough to withstand CMP.

Thus, what is needed is a method of forming a low-dielectric constant material with good mechanical strength and a structure having a low-dielectric constant material with good mechanical strength.

BRIEF DESCRIPTION OF THE DRAWINGS

FIG. 1F is also an illustration of a cross-sectional view of a structure having a low-dielectric constant material with good mechanical strength according to the present invention.

DETAILED DESCRIPTION OF THE PRESENT INVENTION

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

The present invention describes a method of treating a surface of a low-dielectric constant material to achieve good mechanical strength, as shown in an embodiment of the present invention in FIGS. 1A–F. In one embodiment of the present invention, the surface treatment includes sputtering with a heavy ion, such as Argon. In another embodiment of the present invention, the surface treatment includes a reactive plasma, such as in the presence of Hydrogen.

Figure 1A:
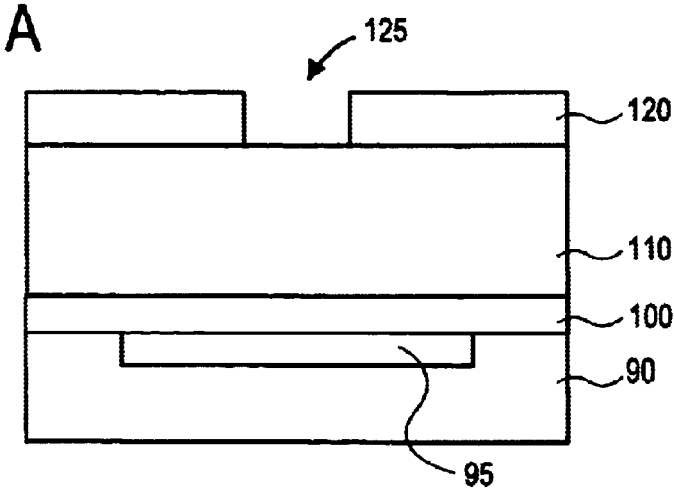
FIGS. 1A–F are illustrations of a cross-sectional view of an embodiment of a method of forming a low-dielectric constant material with good mechanical strength according to the present invention.
Figure 1B:
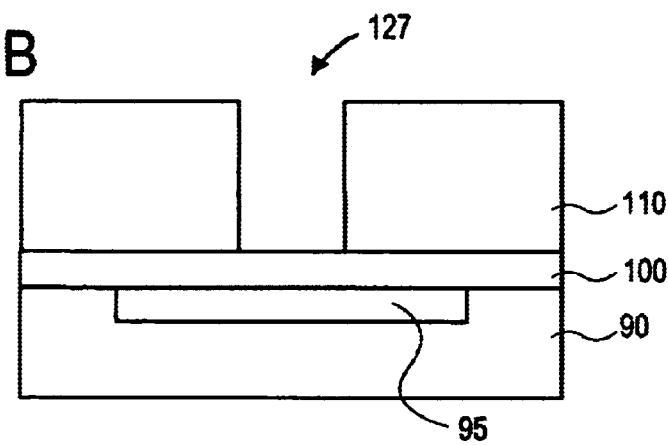
Figure 1C:
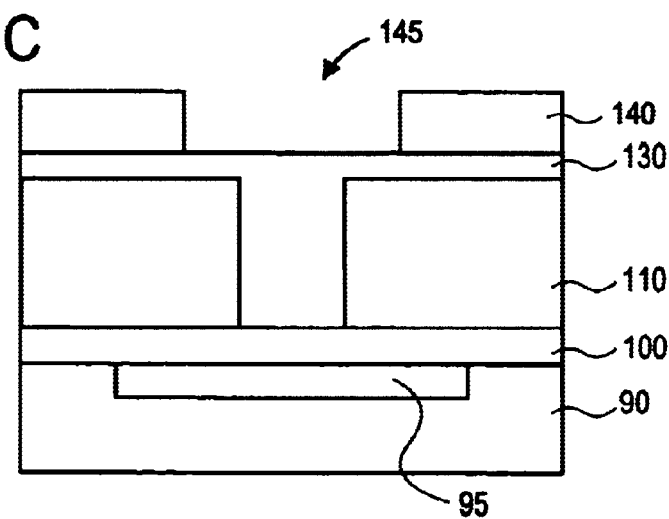
Figure 1D:
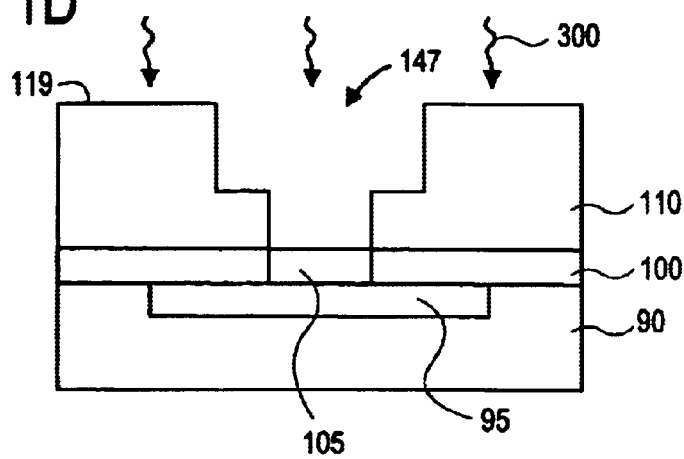
Figure 1E:
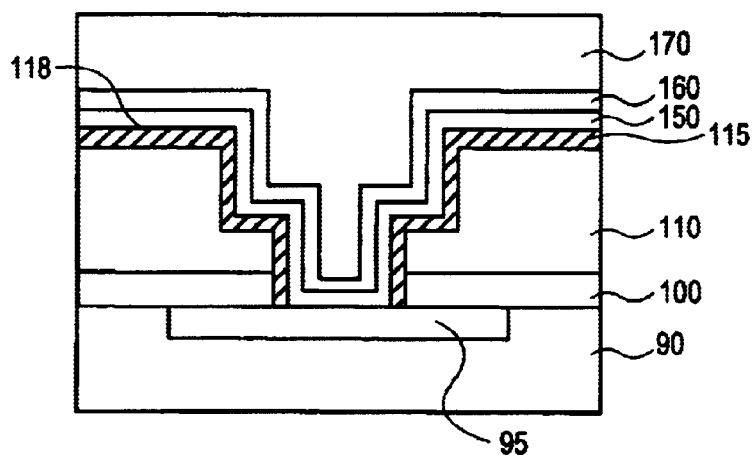
Figure 1F:
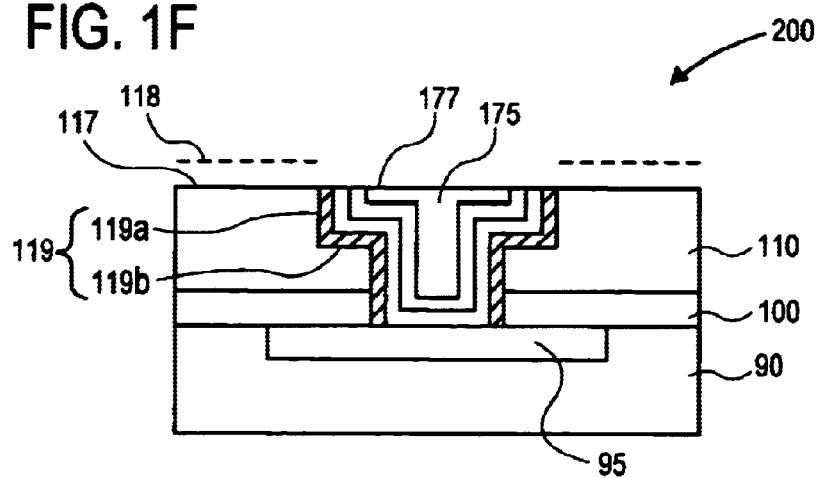

As shown in an embodiment of the present invention in FIG. 1F, the present invention also describes a structure including a low-dielectric constant material in which a treated layer contributes towards good mechanical strength. Measurements of mechanical strength include Young's modulus of elasticity, shear strength, and fracture toughness.

As shown in an embodiment of the present invention in FIG. 1A, an underlying conductor 95, connected to a device, is formed in a dielectric material 90 that is part of a substrate. The dielectric material 90 may be covered with an etch stop layer 100. The etch stop layer 100 may have a thickness selected from a range of about 200–1,500 Angstroms.

The etch stop layer 100 should be thick enough to prevent breakthrough when an opening, such as a via opening 127, is formed later in an overlying dielectric material, such as an interlayer dielectric (ILD) 110, as shown in an embodiment of the present invention in FIG. 1B. The formation of the via opening 127 may involve an etch of the ILD 110, as well as various precleans and postcleans associated with the etch.

The etch stop layer 100 usually has a dielectric constant, k, value that is higher than the k value for the ILD 110 so the thickness of the etch stop layer 100 should be minimized. Materials that may be used for the etch stop layer 100 include Silicon Nitride ($Si_3N_4$) which has a k value of about 6.5 and Silicon Carbide (SiC) which has a k value of about 4.5–5.5. The k value may be determined by measuring capacitance on a parallel-plate electrical structure.

The ILD 110 may be formed over the etch top layer 100. The ILD 110 may have a thickness selected from a range of about 0.1–2.0 microns (um). The k value of the ILD 110 should also be minimized. Otherwise, excessive intralayer and interlayer capacitance may contribute to cross-talk and increase the resistance-capacitance (RC) product delay of an inlaid interconnect 175 to be formed later, as shown in an embodiment of the present invention in FIG. 1F. An increase in RC product delay will degrade switching speed of the device in the substrate that is connected, through the underlying conductor 95, to the inlaid interconnect 175.

The k value of the ILD 110 depends on the device design rules. In general, the k value should be lower as inlaid interconnects 175 are located closer together in the same layer (horizontally) and in different layers (vertically). For a device design rule of about 180 nm, the ILD 110 should have a k value of about 4.0 or lower. For a device design rule of about 130 nm, the ILD 110 should have a k value of about 3.5 or lower. For a device design rule of about 90 nm, the ILD 110 should have a k value of about 3.0 or lower. For a device design rule of about 65 nm, the ILD 110 should have a k value of about 2.5 or lower.

A dielectric material may be considered to be low-k if its k value is lower than the k value of undoped $SiO_2$ which is about 3.9–4.5. Doping $SiO_2$ with Fluorine to form Fluorinated Silicate Glass (FSG or SiOF) reduces k value to about 3.5–4.0. Other low-k materials having even lower k value may be formed from certain organic materials or silicate materials. Low-k materials may also be formed from hybrids of organic and silicate materials, such as organosilicate glass (OSG) or Carbon-doped Oxide (CDO).

The ILD 110 may be formed in various ways, such as by using a CVD process. In one embodiment, the ILD 110 may be formed using a plasma-enhanced CVD (PECVD) process. Process conditions may include a power of about 300–2,500 Watts (W), a pressure of about 500–1,000 Pascals (Pa), and a gas flow rate of about 300–1,000 standard cubic feet per minute (scfm).

Regardless of the k value of the bulk material used to form the ILD 110, pores may be created in the ILD 110 to lower the k value of the ILD 110. The k value of the ILD 110 then depends on the k value of the bulk material forming the ILD 110 and the k value of the material filling the pores, weighted by the total porosity of the ILD 110.

In one embodiment, the total porosity, or void fraction, of the ILD 110 may be about 0.02–0.75. For comparison, a material without pores has a total porosity of zero.

The local porosity of the ILD 110 may vary for a given total porosity. In one embodiment, the local porosity may vary depending on the location (x-position and y-position) in the plane of the device and the substrate. In another embodiment, the local porosity may vary depending on the local thickness of the ILD 110. In still another embodiment, the local porosity may be graded and vary as a function of z-position within the thickness of the ILD 110.

The pores may be filled with a gas. The gas may include air with a k value of 1.0. In one embodiment, the ILD 110, with pores filled with air, may have a k value lower than about 2.0–3.0.

In one embodiment, pores may be created in the ILD 110 by including a pore-forming material, or porogen, when forming the ILD 110. In another embodiment, pores may be created by modifying the processing conditions concurrently with or subsequently to the formation of the ILD 110.

The mechanical strength of the ILD 110 depends on the mechanical strength of the bulk material forming the ILD 110. If the ILD 110 is porous, the mechanical strength of the ILD 110 also depends on the total porosity as well as the distribution of pore sizes and shapes. For a particular value of total porosity, an ILD 110 with larger pore sizes may have greater mechanical strength than an ILD 110 with smaller pore sizes.

The ILD 110 should possess good mechanical strength. Young's modulus of elasticity is one measurement of mechanical strength of a material. In an embodiment of the present invention, the ILD 110 is porous with a Young's modulus of elasticity of about 15 GigaPascals (GPa) or higher.

Shear strength is another measurement of mechanical strength of a material. The shear strength of the ILD 110 should be sufficient to withstand the CMP process that is used later to planarize the conductor layer 170, as shown in an embodiment of the present invention in FIG. 1F. In another embodiment of the present invention, the ILD 110 is porous with a shear strength of about 6 GPa or higher.

A via-first process flow for a dual Damascene scheme will be described next as an embodiment of the present invention. However, another embodiment of the present invention may include a different process flow, such as a trench-first process flow for a dual Damascene scheme. Still another embodiment of the present invention may include a process flow that is compatible with a single Damascene scheme.

After formation of the ILD 110, the processes of photolithography and etch are used to pattern a via 127, as shown in an embodiment of the present invention in FIGS. 1A–B. A radiation-sensitive material, such as a via-layer photoresist 120, may be applied over the ILD 110. Then, a portion of the via-layer photoresist 120 is exposed to radiation of the appropriate wavelength, energy, and dose. The exposure is performed in an imaging tool, such as a stepper or a scanner. A via-layer reticle may be used to modulate the radiation to determine the portion of the via-layer photoresist 120 that is to be exposed. Exposure is followed by development of the via-layer photoresist 120 to create a via-layer mask. The via-layer mask includes a via feature 125 that corresponds to the exposed portion of the via-layer photoresist 120, as shown in an embodiment in FIG. 1A. The shape and critical dimension (CD) of the via feature 125 in the via-layer photoresist 120 is derived from a design on the via-layer reticle.

The via feature 125 patterned in the via-layer photoresist 120 may be transferred into the ILD 110 by an etch process, as shown in an embodiment of the present invention in FIG. 1B. A dry etch process, such as a plasma etch process or a reactive ion etch process (RIE), may be used to etch a via 127 through the ILD 110. Using an etch stop layer 100 under the ILD 110 allows a longer over etch to clean out the bottom of the via 127 without damaging the underlying conductor 95 connected to the device in the substrate.

High directionality is desired for the via 127 etch when the narrowest portion of the via 127 has a large aspect ratio (depth: width), such as about 6:1 or greater. In one embodiment, a high-density plasma, such as a radio-frequency (RF) inductively-coupled plasma (ICP) may be used.

The dry etch of the ILD 110 to form the via 127 may be performed with a gas mixture. The gas mixture for etching an ILD 110 formed from an inorganic material may include an etching gas, such as $CF_4$, and a polymerizing gas, such as $CH_2F_2$. The etching gas serves as a principal source of Fluorine for etching the ILD 110 while the polymerizing gas improves selectivity by passivating the sidewalls of the via 127 during the etch. The etch selectivity of the ILD 110 to the via-layer photoresist 120 may be higher than about 20:1. Other gases that may be used for via 127 etch include $CHF_3$ and $C_3F_6$. The etch rate of the ILD 110 may be selected from a range of about 1,500–12,000 Angstroms per minute.

After via 127 etch has been completed, the via-layer photoresist 120 is removed. If desired, the via 127 etch and the strip of the via-layer photoresist 120 may be performed sequentially in an integrated tool.

The etch stop layer 100 is thick enough to prevent the via 127 etch from breaking through to damage materials in underlying layers, such as the underlying conductor 95 connected to the device in the substrate.

After formation of the via 127, the processes of photolithography and etch are used again to pattern a trench. A bottom anti-reflective coating (BARC) 130 may be formed over the ILD 110 and in the via 127, as shown in an embodiment of the present invention in FIG. 1C. Then, a trench-layer photoresist 140, is applied over the BARC 130. The BARC 130 will minimize exposure problems in the vicinity of the via 127 relating to a combination of swing-curve effects and light-scattering effects caused by a step change in the ILD 110 and a thickness variation in the trench-layer photoresist 140. The BARC 130 also minimizes further etch of the via 127 during the subsequent etch of the trench.

Then, the trench-layer photoresist 140 is exposed using radiation of the appropriate wavelength, energy, and dose. The exposure is performed in an imaging tool, such as a stepper or a scanner, and modulated by a trench-layer reticle. Exposure is followed by development of a trench feature 145 in the trench-layer photoresist 140. The trench feature 145 in the trench-layer photoresist 140 is superimposed over the via 127 that has already been etched into the ILD 110. The shape and CD of the trench feature 145 is derived from a design on the trench-layer reticle.

A dry etch process, such as a plasma etch process or an RIE process, may be used to partially etch the ILD 110 to form a trench over the via 127, as shown in an embodiment of the present invention in FIG. 1D. High directionality is desired for the trench etch when the narrowest portion of the trench-via opening 147 has a large aspect ratio (depth: width), such as about 6:1 or greater. In one embodiment, a high density plasma, such as an RF ICP, may be used for the trench etch.

The dry etch of the ILD 110 to form the combined trench-via opening 147 may be performed with a gas mixture. The gas mixture for etching an ILD 110 formed from an inorganic material may include an etching gas, such as $CF_4$, and a polymerizing gas, such as $CH_2F_2$. The etching gas serves as the principal source of Fluorine for etching the ILD 110 while the polymerizing gas improves selectivity by passivating the sidewalls of the trench-via opening 147. The etch selectivity of the ILD 110 to the trench-layer photoresist 140 may be higher than about 20:1. Other gases that may be used for trench etch include $CHF_3$ and $C_3F_6$. The etch rate of the ILD 110 may be selected from a range of about 1,500–12,000 Angstroms per minute.

After etching the trench-via opening 147 in the ILD 110, the trench-layer photoresist 140 and the underlying BARC 130 are removed. If desired, the trench etch and the strip of the trench-layer photoresist 140 and the BARC 130 may be performed sequentially in an integrated tool.

In one embodiment of the present invention, the portion 105 of the etch stop layer 100 underlying the trench-via opening 147 is then removed, such as by a dry etch, as shown in an embodiment of the present invention in FIG. 1D. The underlying conductor 95 should not be damaged by the removal of the portion 105 of the etch stop layer 100 that is located below the trench-via opening 147.

Next, the ILD 110 is treated 300 to modify the surface properties. As shown in an embodiment of the present invention in FIGS. 1D-E, the exposed surface 119 of the ILD 110 may be treated 300 by sputtering with a heavy ion, such as Argon, to form a treated layer 115 with a treated surface 118. When the ILD 110 includes CDO, sputtering with Argon may deplete Carbon by a factor of 5–20 in the top 5 atomic layers below the exposed surface 119 of the CDO.

In another embodiment of the present invention, the exposed surface 119 of the ILD 110 may be treated 300 with a reactive plasma in the presence of a reactive ion, such as Hydrogen, to form the treated layer 115 with the treated surface 118. When the ILD 110 includes CDO, the reactive plasma may reduce the ratio of weaker Methyl group bonds to stronger Si—O bonds.

In one embodiment of the present invention, the treatment 300 may include concurrent processing at a raised temperature. In another embodiment-of the present invention, a rapid thermal anneal (RTA) may be used subsequent to the treatment 300.

The treatment 300 may change the material properties of the ILD 110. In an embodiment of the present invention, the treatment 300 may change the density of the ILD 110 up to some distance inwards from the exposed surface 119. In another embodiment of the present invention, the treatment may change the composition of the ILD 110 up to some distance inwards from the exposed surface 119.

The treatment 300 may also change the mechanical properties of the ILD 110, thus affecting removal rate when CMP is later performed to planarize the conductor layer 170, as shown in an embodiment of the present invention in FIG. 1E. In one embodiment of the present invention, the treated surface 118 of the treated layer 115 is harder than the original exposed surface 119 of the ILD 110. In another embodiment of the present invention, the bulk of the treated layer 115 is tougher than the bulk of the ILD 110.

The treated layer 115 may have a thickness of about 30–600 Angstroms. By resisting deformation, fracture, or delamination during CMP of the ILD 110, the treated layer 115 prevents electrical shorts and polish-induced defects which would otherwise degrade yield. A treated layer 115 with a greater thickness may be more helpful during CMP, but may also be more difficult to remove later.

The thickness and conformality of the treated layer 115 may depend on various parameters of the treatment 300, such as energy, dose, directionality, duration, and temperature. For example, a treatment 300 that is more directional may result in a treated layer 115 that is less conformal.

In another embodiment of the present invention, the ILD 110 is treated, such as by sputtering or reactive plasma, before the portion 105 of the etch stop layer 100 underlying the trench-via opening 147 is removed. Such a sequence may be helpful, especially if the treatment 300 may damage the underlying conductor 95.

The trench-via opening 147 will be filled later with a conductor layer 170 to make electrical contact with the device connected to the underlying conductor 95, as shown in an embodiment in FIG. 1E. The conductor layer 170 may be formed from Copper which has a high diffusivity. As a result, a barrier layer 150 is first formed over the ILD 110 and in the trench-via opening 147. The barrier layer 150 must encapsulate the sides and the bottom of the trench-via opening 147 to prevent diffusion of Copper into the ILD 110 and the device connected to the underlying conductor 95. Otherwise, Copper may introduce mid-gap states into the semiconductor material forming the device and degrade carrier lifetime.

The barrier layer 150 may be formed from a metal, including a refractive metal, such as Tantalum (Ta), or an alloy, such as Titanium-Tungsten (TiW), or a ceramic, such as Tantalum-Nitride (TaN), Tantalum-Silicon-Nitride (TaSiN), Titanium-Nitride (TiN), or Tungsten-Nitride (WN). The barrier layer 150 may have a thickness selected from a range of about 80–500 Angstroms.

In one embodiment, the barrier layer 150 may include a lower layer of TaN to adhere to the underlying ILD 110 and an upper layer of Ta to adhere to the overlying seed layer 160. A barrier layer 150 formed as a bilayer may have a total thickness selected from a range of about 75–350 Angstroms.

High directionality is desired for forming the barrier layer 150, especially when the narrowest portion of the trench-via opening 147 has a large aspect ratio (depth:width), such as 6:1 or greater. The technique of ionized physical vapor deposition (I-PVD) may be used to form a material with better step coverage than other techniques, such as collimation sputtering or long-throw sputtering (LTS).

In certain cases, a MOCVD process may be used to form the barrier layer 150. Alternatively, the barrier layer 150 may be formed using atomic layer deposition (ALD), especially for a thickness of about 100 Angstroms or less. ALD may provide good conformality, step coverage, and thickness uniformity even while permitting the use of a lower deposition temperature, such as about 200–400 degrees Centigrade.

When the trench-via opening 147 is to be filled later by electroplating a conductor layer 170, a seed layer 160 should first be formed over the barrier layer 150, as shown in an embodiment in FIG. 1E. In order to serve as a base for electroplating, the seed layer 160 must be electrically conductive and continuous over the barrier layer 150. Adhesion loss of the seed layer 160 from the underlying barrier layer 150 should be prevented. Interfacial reaction of the seed layer 160 with the underlying barrier layer 150 should also be prevented.

The seed layer 160 may be formed from the same or different material as the conductor layer 170 to be formed later. For example, the seed layer 160 may include a metal, such as Copper, or an alloy. The seed layer 160 may have a thickness selected from a range of about 500–2,000 Angstroms.

The seed layer 160 may be formed by I-PVD, especially when the conductor layer 170 is to be formed later by electroplating. If desired, the barrier layer 150 and the seed layer 160 may be sequentially deposited in a tool, without breaking vacuum, so as to prevent formation of an interfacial layer between the barrier layer 150 and the seed layer 160.

When the conductor layer 170 is to be subsequently formed by PVD, better material properties and surface characteristics may be achieved for the conductor layer 170 if the seed layer 160 is formed using CVD. The seed layer 160 may also be formed with ALD or electroless plating.

The conductor layer 170, such as a metal, may be formed over the seed layer 160 by an electrochemical process, such as electroplating. The conductor layer 170 may have a thickness that provides an overburden of about 1,000–4,000 Angstroms above the ILD 110.

In other embodiments, the conductor layer 170 may be formed with a PVD or CVD process. A PVD or CVD process may be particularly advantageous when forming the conductor layer 170 over a trench-via opening 147 that has a large aspect ratio (depth:width), such as about 6:1 or greater. A PVD process usually has a lower Cost-of-Ownership (CoO) than a CVD process. In some cases, a MOCVD process may also be used.

The conductor layer 170 may be treated after being formed to modify its material properties or surface characteristics. The treatment may include a rapid thermal anneal (RTA) process to modify or stabilize grain size. For example, Copper that is formed by electroplating may have a grain size of about 0.05–10.0 um, depending on the thickness, deposition conditions, and anneal conditions. A larger grain size usually corresponds to a lower resistivity which is more desirable. Copper may have a resistivity of about 1.7–2.5 micro-ohm-centimeter (uohm-cm) at 20 degrees Centigrade.

A chemical-mechanical polishing (CMP) process may be used to remove the overburden of the conductor layer 170 and the portion of the barrier layer 150 over a treated surface 118 of the ILD 110 as shown in an embodiment in FIG. 1E. The process of CMP combines abrasion and dissolution to flatten and smoothen surface relief. Abrasion occurs when higher portions of the surface contact a polish pad and abrasive particles in a polish slurry and become subject to mechanical forces. Dissolution occurs when materials at the surface contact chemicals in the slurry and become subject to chemical or electrochemical reactions.

The goal of the CMP process is an inlaid interconnect 175 in the trench-via opening 147, as shown in an embodiment in FIG. 1F. The CMP process to create an inlaid interconnect 175 in the trench-via opening 147 requires an optimization of the polish selectivity of the different materials that are present. Polish rate of each of the materials depends on selection of the polish pad, the slurry, and the polish tool parameters. In one embodiment, the slurry for CMP may include an abrasive, an oxidizer, a corrosion inhibitor, and various other additives. The abrasive may include particles of a hard material, such as Alumina ($Al_2O_3$) or Silica ($SiO_2$).

In a first embodiment of the present invention, the CMP process involves three polishes. The first polish removes most of the overburden of the conductor layer 170. The second polish planarizes the remaining conductor layer 170 and the portion of the seed layer 160 that is located over the barrier layer 150. The polish rate of the conductor layer 170 in the first polish and the second polish may be selected from a range of about 900–13,000 Angstroms per minute. The third polish removes the portion of the barrier layer 150 that is located over the treated surface 118 of the ILD 110.

In a second embodiment of the present invention, the CMP process involves two polishes. The first polish removes all of the overburden of the conductor layer 170 and planarizes the conductor layer 170 and the portion of the seed layer 160 that is located over the barrier layer 150. The second polish removes the portion of the barrier layer 150 over the treated surface 118 of the ILD 110.

In a third embodiment of the present invention, the CMP process involves one polish to remove all of the overburden of the conductor layer 170, as well as the portions of the barrier layer 150 and the seed layer 160 that are located over the treated surface 118 of the ILD 110.

Leaving the full thickness of the treated layer 115 over a field region of the ILD 110 may increase the effective dielectric constant of the total stack by 5–10%. Consequently, it may be desired to completely remove the treated layer 115 over the field region of the ILD 110 in one embodiment of the present invention. However, the portion of the treated layer 115 over the sidewalls of the trench-via opening 147 is not removed. In one embodiment of the present invention, the treatment 300 of the present invention is highly directional in a vertical direction so the treated layer left over the sidewalls of the trench-via opening 147 and around the inlaid interrconnect 175 is thicker on a horizontal surface 119b than on a vertical surface 119a.

Depending on polish selectivity and the extent of overpolish, polishing of the treated surface 118 of the ILD 110 may result in a lowered upper surface 117 of the ILD 110 as shown in an embodiment of the present invention in FIG. 1F. After the CMP process, an upper surface 177 of the inlaid interconnect 175 should be approximately flat and level with the new upper surface 117 of the ILD 110.

After planarization with CMP, another etch stop layer may be formed over the upper surface 177 of the inlaid interconnect 175 and the upper surface 117 of the ILD 110. In some cases, the etch stop layer may also serve as a capping layer to prevent diffusion, intermixing, or reaction of the inlaid interconnect 175 with the surrounding materials.

A process sequence similar to the embodiment shown in FIGS. 1A–F may be repeated to form the next higher layer of inlaid interconnect. In a dual Damascene scheme, each layer includes a via and an overlying trench. The total number of layers may depend on the device design rules. In one embodiment, a total of 7–10 layers may be formed.

The present invention also discloses a structure 200 including a dielectric, such as an ILD 110, having a low dielectric constant and good mechanical strength; an opening located in the ILD 110; a treated layer 115 located over a sidewall of the opening; and an inlaid interconnect 175 located in the opening and over the treated layer 115. An embodiment of the present invention is shown in FIG. 1F.

In one embodiment, the ILD 110 may include a dielectric material, such as $SiO_2$, SiOF, or CDO. The ILD 110 may include pores. The total porosity, or void fraction, may be about 0.02–0.75. In an embodiment of the present invention, the ILD 110 may have a k value of about 3.0 or lower, a Young's modulus of elasticity of about 15 GPa or higher, and a shear strength of about 6 GPa or higher.

The opening located in the ILD 110 may include a via with an overlying trench. The treated layer 115 located over a sidewall of the opening may have a thickness of about 30–600 Angstroms. In an embodiment of the present invention, horizontal portions 119b of the treated layer 115 are thicker than vertical portions 119a of the treated layer 115.

When the ILD 110 includes a dielectric material such as CDO, the treated layer 115 may be Carbon-depleted. The Carbon-depletion may be by a factor of about 5–20 in the top 5 atomic layers below the surface of the CDO. The treated layer 115 may have a reduced ratio of weaker Methyl group bonds to stronger Si—O bonds.

The treated layer 115 may have different material or mechanical properties from the ILD 110. The treated layer 115 may be harder or tougher than the ILD 110. The inlaid interconnect 175 located in the opening and over the treated layer 115 may include a metal, such as Copper, or an alloy.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

Thus, we have described a method of forming a low-dielectric constant material with good mechanical strength and a structure having a low-dielectric constant material with good mechanical strength.

We claim:

1. A method comprising:
   providing a substrate;
   forming a dielectric material over said substrate;
   forming an opening in said dielectric material;
   treating a surface of said dielectric material to achieve good mechanical strength;
   forming a conductor in said opening;
   and planarizing said conductor.

2. The method of claim 1 wherein said treating of said surface of said dielectric material comprises a directional process.

3. The method of claim 1 wherein said treating of said surface of said dielectric material comprises sputtering.

4. The method of claim 1 wherein said treating of said surface of said dielectric material comprises reactive plasma.

5. The method of claim 1 wherein said dielectric material comprises Carbon-doped Oxide (CDO).

6. The method of claim 1 wherein said treating of said surface of said dielectric material forms a treated layer with different properties from said dielectric material.

7. The method of claim 6 wherein said planarizing of said conductor removes said treated layer over a field region of said dielectric material.

8. The method of claim 1 wherein said treating of said surface of said dielectric layer forms a treated layer with a thickness of about 30–600 Angstroms.

9. A method comprising:
   providing a substrate;
   forming an interlayer dielectric (ILD) over said substrate, said ILD having a low dielectric constant;
   forming a via and an overlying trench in said ILD;
   treating said ILD to form a treated layer with good mechanical strength;
   forming a conductor over said treated layer; and
   removing said conductor and said treated layer outside said via and said overlying trench.

10. The method of claim 9 wherein said treating of said ILD comprises sputtering.

11. The method of claim 9 wherein said treating of said ILD comprises reactive plasma.

* * * * *